United States Patent [19]

Schmerda et al.

[11] Patent Number: 4,945,445

[45] Date of Patent: Jul. 31, 1990

[54] CURRENT SENSE CIRCUIT

[75] Inventors: Richard F. Schmerda, Milwaukee; John A. Dombeck, Glendale, both of Wis.; Lance R. Kaufman, Paradise Valley, Ariz.

[73] Assignee: Gentron Corporation, Milwaukee, Wis.

[21] Appl. No.: 251,671

[22] Filed: Sep. 29, 1988

[51] Int. Cl.⁵ .............................................. H02H 3/08
[52] U.S. Cl. ..................................... 361/101; 361/94; 361/87; 324/123 C; 324/126; 323/277; 323/280; 307/356; 307/521
[58] Field of Search ................ 361/79, 87, 93, 94, 361/95, 96, 97, 98, 100, 101, 18, 90; 324/73 PC, 123 C, 124, 126; 323/276, 277, 280; 307/130, 131, 355, 356, 521; 330/258

[56] References Cited

U.S. PATENT DOCUMENTS

| | | | |
|---|---|---|---|
| 3,832,646 | 8/1974 | Szabó | 330/258 |
| 4,032,766 | 6/1977 | Hughes et al. | 361/93 |
| 4,157,513 | 6/1979 | Ghiringhelli et al. | 361/97 |
| 4,337,494 | 6/1982 | Huykman | 361/101 |
| 4,369,354 | 1/1983 | Goedecke et al. | 361/106 |
| 4,623,950 | 11/1986 | Palara et al. | 361/79 |
| 4,659,997 | 4/1987 | Ferland et al. | 324/123 C |
| 4,703,390 | 10/1987 | Fay et al. | 361/101 |
| 4,713,607 | 12/1987 | Pepper | 324/73 PC |
| 4,819,117 | 4/1989 | Brennan et al. | 361/18 |

OTHER PUBLICATIONS

"Current Sensing HEXSense Power MOSFETS Simplify SMPS Design and Lower Losses", Sean Young, PCIM (Power Conversion and Intelligent Motion Magazine), Jul. 1987, pp. 76-83.

Primary Examiner—William M. Shoop, Jr.
Assistant Examiner—H. L. Williams
Attorney, Agent, or Firm—Andrus, Sceales, Starke & Sawall

[57] ABSTRACT

A current sense circuit (100) includes a semiconductor power switch such as a MOSFET (102) having a source metallization contact pad (14) with a conductor jumper bond wire (106) directly connected thereto in the MOSFET module housing (104), which bond wire is connected to a source terminal lead frame within the module, which lead frame extends externally of the module for connection to a load (22) and load voltage (24). The current sense circuitry includes amplifier circuitry (150, 168) having first and second inputs (122, 124) connected to the source bond wire (106) at spaced points (126, 128) along the bond wire within the module housing (104) without insertion of additional series shunt resistance in the bond wire (106) between such points (126, 128), and sensing current flow through the bond wire (106) by sensing voltage between such points (126, 128) and amplifying such voltage. A comparator (218) compares the amplified voltage against a reference voltage (226) and generates an output signal (232) when the amplified voltage exceeds the reference voltage by a given amount. The output signal disables gate drive to the MOSFET. The speed of the gate drive signal is improved by providing a separate gate return jumper bond wire to the MOSFET source. Another comparator (242) compares thermistor (238) voltage, measuring MOSFET temperature, against a reference voltage (246) and generates an output signal (260) which disables gate drive to the MOSFET when the latter's temperature exceeds a given level, to provide overtemperature protection in combination with overcurrent protection.

3 Claims, 4 Drawing Sheets

CURRENT SENSE CIRCUIT

BACKGROUND AND SUMMARY

The invention relates to circuitry for sensing current flow through a semiconductor power switch, for disabling gate or base drive thereto, to protect the semiconductor power switch.

The present invention arose during continuing development efforts directed toward utilizing the physical interconnection structure and circuit assembly shown in pending application Ser. No. 07/120,632, filed Nov. 13, 1987, now U.S. Pat. No. 4,818,895 issued Apr. 4, 1989 entitled "Direct Current Sense Lead". Electrical circuit assemblies typically include an electrically insulating thermally conductive substrate, such as ceramic, having a plurality of electrically conductive lead frames, such as copper, mounted on the substrate, and various semiconductor elements mounted on the lead frames and enclosed by an electrically insulating housing, providing a module. The lead frames extend externally of the housing module. Examples of such circuit assemblies are shown in U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273, 4,713,723, 4,724,514, 4,739,449, incorporated herein by reference. In other circuit assemblies, such as type TO-218, the ceramic substrate is deleted from the bottom of the housing, and the lead frame pads are left exposed when supplied to the user. The user mounts the package to a ceramic or other substrate according to his particular application.

The above noted U.S. Pat. No. 4,818,895 involves the physical interconnection structure in such circuit assemblies for gate return referencing, and also for current sensing applications. The latter enables current mode control of switched mode power supplies, which has been recognized as a better approach than voltage controlled methods, as noted in "Current Sensing Hex-Sense Power MOSFETs Simplify SHPS Designs And Lower Losses", Sean Young, PCIH (Power Conversion and Intelligent Motion Magazine), July, 1987, page 76-83. As noted in the Young article, current mode control has advantages of improved stability, automatic feed forward compensation for input voltage variations, pulse by pulse current limiting, and ease of paralleling supplies. The current mode control approach has become popular due to a variety of integrated circuits available to handle the control functions. A disadvantage to the current mode control has been the lack of an efficient means of monitoring instantaneous values of currents in the switching devices.

A noted in the Young article, in the past the current sensing function was usually done using either a sensing resistor or a current transformer in series with the switching device. The disadvantage of the series resistor is that it must always handle energy-resulting in high heat dissipation, and its ohmic value must be chosen as a compromise between keeping such dissipation low, while at the same time generating a large enough signal. The disadvantage of the current transformer approach is that it is a magnetic component prone to saturation.

The Young article notes a current sensing power MOSFET component, the HexSense, which provides current sensing with negligible electrical losses. Such components are identical to standard power MOSFETs except that current from a few MOSFET cells are diverted to a separate source pin providing a known ratio of total current. Another pin, known as the Kelvin source, is connected to a point on the main source metallization. This Kelvin connection is the return point for the sense circuit. The voltage drop across the Kelvin pin is negligible and is unaffected by the magnitude of the main source current. This arrangement avoids errors in current sensing accuracy that would result if a voltage drop existed between the return point and the source metallization.

The present invention provides current sensing circuitry which may be connected to the structure in the above noted U.S. Pat. No. 4,818,895 and to other structures and circuit assemblies. The semiconductor chip has a pair of main terminal contact metallization pads, one of which is preferably mounted in electrical contact on a main terminal lead frame, and the other of which has a conductor jumper bond wire directly connected thereto within the housing module. The bond wire is connected to another main terminal lead frame within the housing module, and both lead frames extend externally of the housing module. The sensing circuitry includes amplification circuitry having a pair of inputs connected to the noted bond wire at spaced points therealong within the housing module and sensing current flow through the bond wire by sensing voltage between such points. The inputs are connected to an existing bond wire at the spaced points without insertion of any additional series resistance in the bond wire between the points.

The sensing circuitry includes filters rejecting high frequency noise, and filters preventing oscillation. The circuitry also includes a temperature sensor to provide thermal protection in combination with overcurrent protection. Gate or base drive for the semiconductor power switch is disabled in response to either overcurrent or overtemperature. The circuitry is fast acting and disables gate or base drive before damage occurs to the semiconductor chip.

BRIEF DESCRIPTION OF THE DRAWINGS

FIG. 4 is a view of a portion of the structure of FIG. 3 taken along line 4—4, prior to attachment of jumper wire 48a.

DETAILED DESCRIPTION

Figure 1:
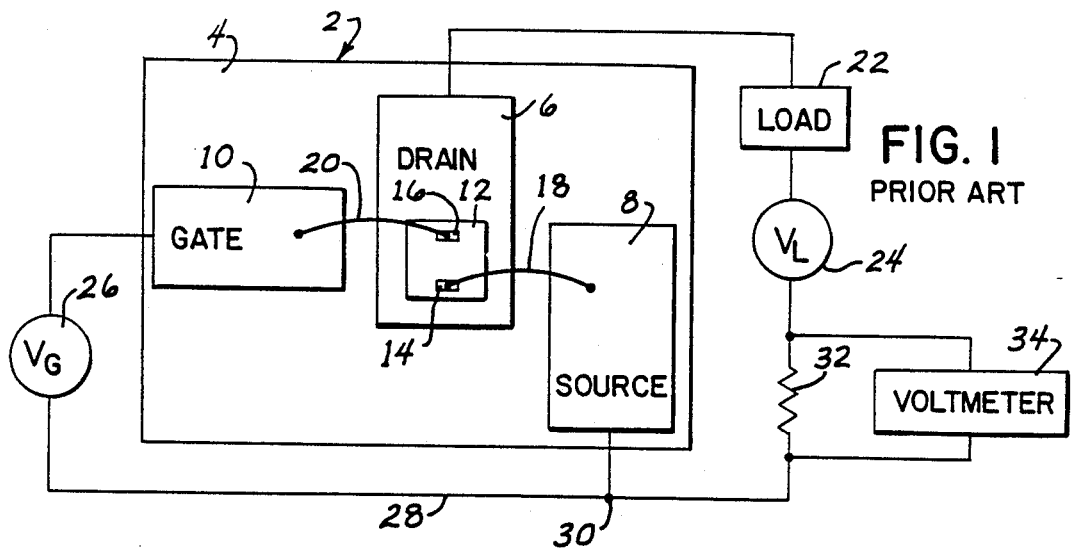
FIG. 1 is a schematic illustration of an electrical circuit assembly known in the prior art, and is taken from FIG. 1 of the above noted U.S. Pat. No. 4,818,895.

FIG. 1 shows an electrical circuit assembly 2 including an electrically insulating thermally conductive ceramic substrate 4, and a plurality of electrically conductive copper lead frames 6, 8 and 10 mounted on the substrate. One or more semiconductor chips such as 12 are mounted on the lead frames in various electrical circuit configurations. The structure is covered by an electrically insulating housing (not shown) which clamps substrate 4 to a heat sink (not shown), for example as shown in the above noted circuit assembly patents. A TO-218 circuit assembly is similar, except that the lead frames are mounted to a housing which is supplied from the manufacturer without a ceramic substrate, which housing is later mounted to a ceramic substrate by the user.

In the particular embodiment shown in FIG. 1, chip 12 is a MOSFET having a lower drain terminal connection pad mounted on drain lead frame 6 in electrical contact therewith. MOSFET 12 has a top surface with an upper source terminal connection pad 14 and a gate terminal connection pad 16. The connection pads are typically metallized aluminum. A source terminal jumper conductor wire 18 is connected between source pad 14 and source lead frame 8. A gate terminal jumper conductor wire 20 is connected between gate pad 16 and gate lead frame 10. Lead frames 6 and 8 provide the main terminals for the main current flow path through chip 12 from drain to source and through the external load circuit through load 22 and load voltage source 24. Gate lead frame 10 provides a control terminal for controlling the main current flow. MOSFET 12 is biased into conduction by gate voltage source 26. The gate return reference is provided through connection 28 to source terminal 8 at node 30.

The MOSFET source current flows from source pad 14 through jumper wire 18 through lead frame 8 to node 30 and then to the load voltage source 24. The gate return reference current flows from source pad 14 through jumper wire 18 through lead from 8 to node 30 and then through conductor 28 back to gate voltage source 26. The current flow path between source pad 14 and node 30 thus contains both main source current and gate return reference current.

For current sensing applications, for example as noted in the above Young article, a resistor 32 is connected in series with the source lead, and a voltmeter 34 senses the IR drop across the resistor.

Figure 2:
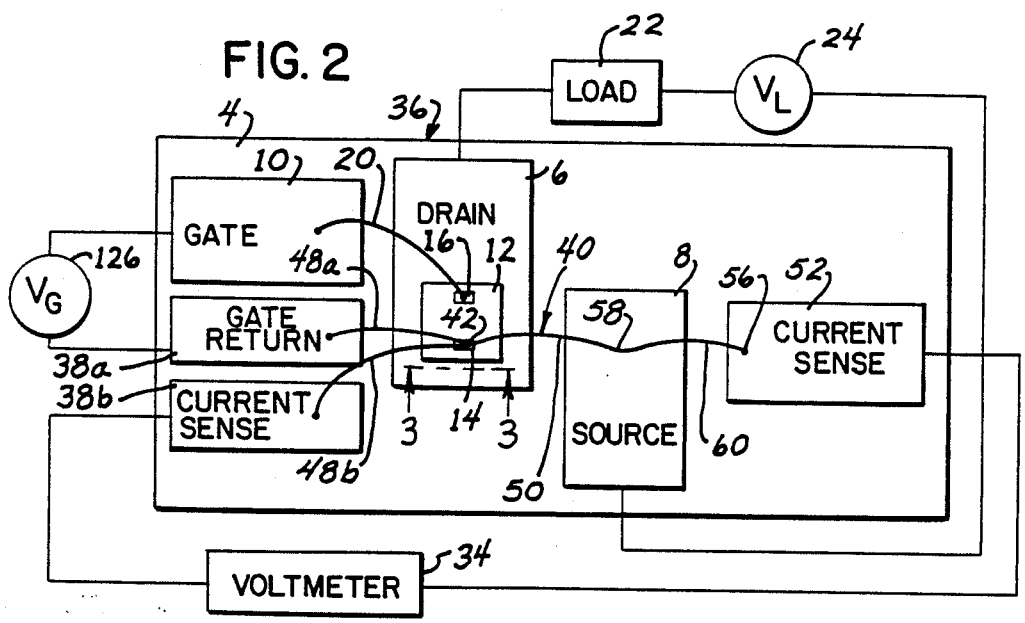
FIG. 2 is a schematic illustration of an electrical circuit assembly similar to that shown in FIG. 2 of the above noted U.S. Pat. No. 4,818,895.
Figure 3:
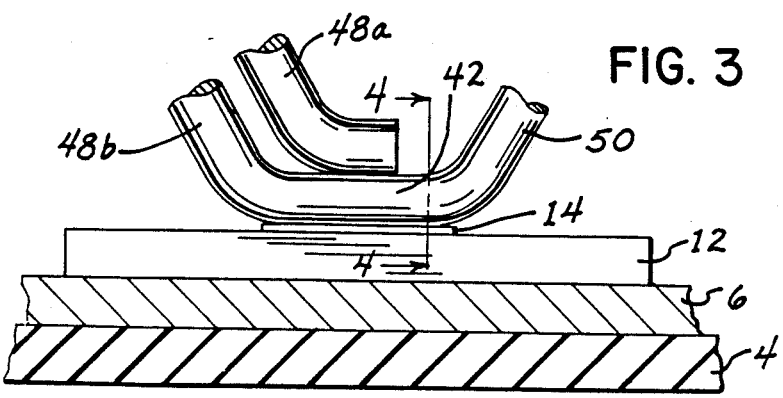
FIG. 3 is an enlarged side view of a portion of the structure of FIG. 2 taken along line 3—3.
Figure 5:
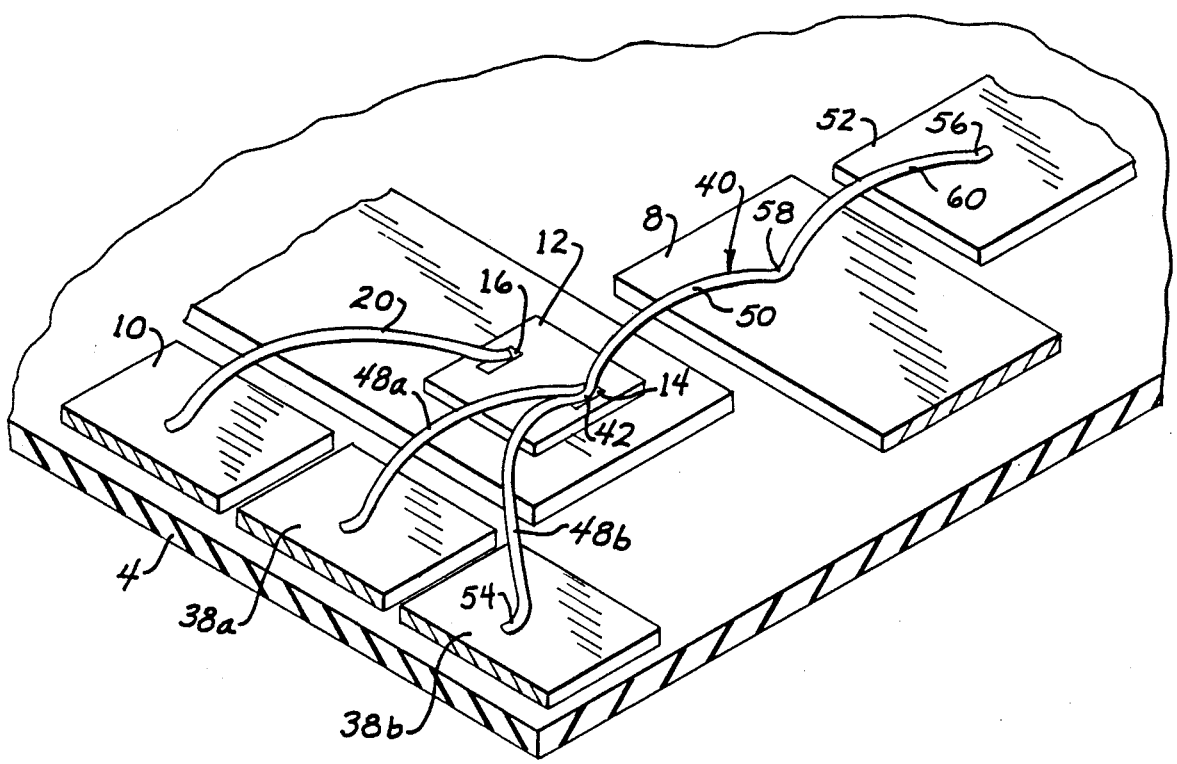
FIG. 5 is a perspective view of a portion of the assembly of FIG. 2.
Figure 6:
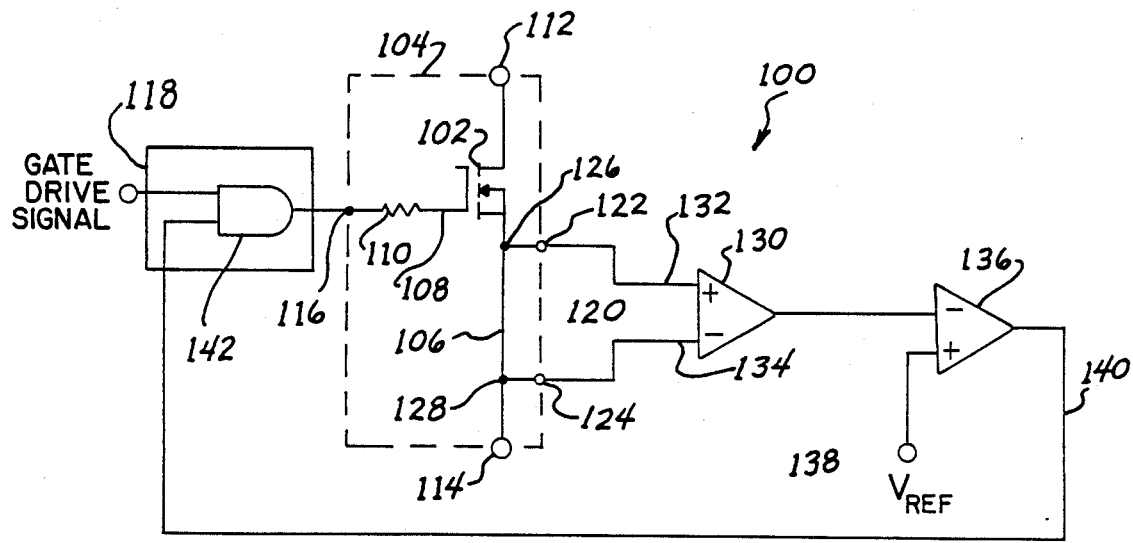
FIG. 6 is a circuit diagram of current sense circuitry in accordance with the invention.

FIGS. 2 and 5 show an electrical circuit assembly 36 similar to that shown in FIGS. 2 and 6 of the above noted U.S. Pat. No. 4,818,895, and use like reference numerals from said FIGS. 2 and 6 and from above FIG. 1 where appropriate to facilitate clarity. As in FIG. 1, MOSFET 12 has a bottom drain terminal connection pad of given lateral size, usually the entire lateral size of the chip. MOSFET 12 has an upper source terminal connection pad 14 and a gate terminal connection pad 16 of limited lateral size substantially smaller than the lateral size of the chip. In FIG. 2 of the above noted U.S. Pat. No. 4,818,895, a single common lead frame (38) and respective jumper wire section (48) provide both gate return connection and current sense connection. In FIG. 2 of the present application, such lead frame is split into separate lead frames 38a and 38b and respective jumper wire sections 48a and 48b providing gate return connection and current sense connection, respectively. As in the above noted U.S. Pat. No. 4,818,895, the structure in present FIGS. 2 and 5 maximizes switching speed by minimizing the portion of the source terminal main power current flow path through which the gate return reference signal must flow.

In the prior art of FIG. 1, the gate return reference terminal 28 is connected through the source terminal, or at least a portion thereof, to source pad 14. Because the gate return reference current flow path shares a common portion with the source current flow path, there is a given amount of inductance in the overall gate return reference terminal. This inductance is significantly higher than that which would be possible with a direct connection of the gate return reference to source pad 14. However, source pad 14 has only a limited lateral size, which restricts the size of terminals or wires which can fit thereon. This limited lateral size also restricts the number of laterally adjacent bonds which can be formed thereon.

The above noted U.S. Pat. No. 4,818,895, provides structure for minimizing the inductance in the gate control return reference terminal connection to gate voltage source 26. In the above noted U.S. Pat. No. 4,818,895, FIGS. 2 and 6, the gate return reference terminal is connected directly at source pad 14 with the same bond that connects source terminal portion 50 at source pad 14. This in turn minimizes the number of laterally adjacent bonds at source pad 14 which would otherwise restrict the size of terminals which can fit within the given limited lateral size of source pad 14. In the above noted U.S. Pat. No. 4,818,895, only a single bond is used at source pad 14 because the gate return reference connection and current sense connection are provided by a single common jumper wire (48). In FIG. 2 of the present application, as noted above, separate jumper bond wire sections 48a and 48b are provided for gate return connection and current sense connection, respectively. Current sense connection bond wire section 48b is integral and continuous with source jumper wire section 50, which sections are part of a single continuous jumper bond wire 40. Jumper bond wire 40 is connected by a single bond at middle portion 42 to source pad 14 by a stitch bond, which bond is known in the art and described hereinafter. Current sense connection bond wire section 48b and source jumper wire section 50 are thus connected by a single bond at middle portion 42 to source pad 14. Gate return reference jumper wire 48a is bonded on top of middle portion 42 of jumper wire 40 with an additional bond. Alternatively, bond wire 48a is bonded to source pad 14 laterally adjacent middle portion 42 of jumper wire 40. The bond at middle portion 42 connecting both jumper wire sections 48b and 50 to source pad 14 minimizes the lateral area otherwise required for separate connection bonds therefore, and enables the choice of a separate laterally adjacent bond for jumper wire 48a on source pad 14 or the bonding of jumper wire 48a on top of middle portion 42. The latter is preferred to even further minimize the lateral area on source pad 14 required for jumper wire connections. In a further alternative, jumper bond wire section 48a is integral and continuous with jumper wire section 50, and jumper bond wire section 48b is a separate wire bonded on top of bond wire 40 at portion 42 or laterally adjacent thereto at source pad 14.

Figure 4:
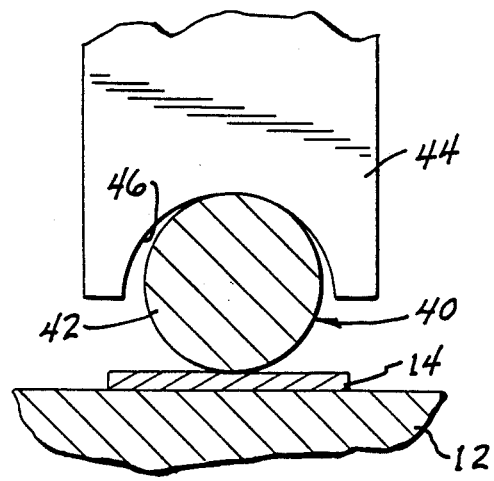

In the preferred embodiment as seen in present FIGS. 2 and 5, a combined source terminal jumper conductor and current sense terminal jumper conductor is provided by a single continuous conductor wire 40 connected between current sense lead frame 38b and source lead frame 8, and has middle portion 42 connected to source pad 14. Middle portion 42 is connected to source pad 14 with a simple stitch bond providing a single weld in a single step. As shown in FIG. 4, a welding fixture 44 having an inverted U-shaped configuration 46 is placed transversely across conductor wire 40 at middle portion 42, and the wire is ultrasonically stitch bonded to source pad 14. Current sense terminal section 48b of jumper wire 40 and source terminal section 50 of jumper wire 40 are thus continuous with each other and connected in common to source pad 14. Gate return reference terminal jumper wire 48a is bonded to jumper wire 40 at portion 42 such that jumper wires 48a and 40 are connected together in common at source pad 14. This common connection is the only portion of the source terminal carrying both gate return reference current and source current, whereby to minimize the voltage drop due to the inductance in the gate return reference terminal by minimizing the length thereof which additionally carries source terminal current flow.

Also in accordance with the above noted U.S. Pat. No. 4,818,895, a current sense terminal lead frame 52 is mounted on substrate 4. Single conductor jumper wire 40 is continued rightwardly in FIGS. 2 and 5 to also be connected to current sense lead frame 52. Jumper wire 40 has its left end 54 connected to current sense lead frame 38b by a stitch bond as above described. Wire 40 has its right end 56 connected to current sense lead frame 52 by a stitch bond. Jumper wire 40 has a first middle portion 42, as above noted, stitch bonded to source pad 14. Jumper wire 40 has a second middle portion 58 stitch bonded to source lead frame 8. Section 50 of wire 40 is between middle portions 42 and 58. Source current from source pad 14 through source lead frame 8 to load voltage source 24 is sensed according to the IR drop across section 50 of jumper wire 40, without the need of an auxiliary resistor such as 32 in FIG. 1. The voltage at middle portion 42 of jumper wire 40 is sensed at the left end 54 of the wire at current sense lead frame 38b. The voltage at middle portion 58 of jumper wire 40 is sensed at right end 56 of the wire at current sense lead frame 52. Voltmeter 34 is connected between lead frames 38b and 52.

Current sense lead frame 52 is connected through section 60 of jumper wire 40 to source lead frame 8 at a point 58 spaced from source pad 14 and defining a given length of the source terminal through jumper wire section 50 therebetween. The current sense reference terminal provided by lead frame 38b and jumper bond wire section 48b serves as a current sense terminal such that current flow through source pad 14 and the source terminal provided by wire section 50 and lead frame 8 may be sensed according to the IR drop across wire section 50 providing the noted given length of the source terminal, all without the need of an auxiliary resistor. The current sense terminal provided by lead frame 38b and wire section 48b provides direct current sensing at source pad 14.

FIG. 6 shows a current sense circuit 100 in accordance with the invention. A semiconductor power switch provided by a semiconductor chip such as MOSFET 102 is housed in a module 104, for example as shown in the above incorporated patents. The semiconductor chip has a pair of main terminal metallization contact pads, for example a bottom drain pad, and a top source pad 14, FIG. 1. The source contact pad has a conductor jumper bond wire 106, FIG. 6, directly connected thereto, for example as also shown at 18 FIG. 1, and 50 in FIGS. 2 and 5. The semiconductor chip also has a control terminal metallization contact pad, such as gate pad 16 in FIGS. 1, 2 and 5. The gate pad has a conductor jumper bond wire 108, FIG. 6, directly connected thereto, and for example as shown at 20 in FIGS. 1, 2 and 5. The gate jumper bond wire may also be connected to a series resistor 110 within the module for limiting gate current in certain applications. The bottom drain contact pad is bonded, e.g. by soldering, on top of a drain terminal lead frame within the housing module, which lead frame extends externally of the housing module to provide a drain connection terminal 112 for connection to load 22, FIG. 2. The source bond wire is connected to a source terminal lead frame within the housing module, which lead frame extends externally of the housing module and provides a source connection terminal at 114, for connection to voltage source 24, FIG. 2. The gate bond wire 108 is connected to a gate terminal lead frame, through resistor 110, if used, which lead frame extends externally of the module and provides an external gate terminal connection at 116 for connection to gating voltage source 26, FIG. 2. Control terminal 116 controls the conduction state of power MOSFET switch 102 between an ON state passing current between main terminals 112 and 114, and an OFF state blocking current flow between main terminals 112 and 114. Control drive circuitry schematically shown at box 118 is connected to gate bond wire 108 through lead frame 116 and has an enabled state supplying a drive signal to MOSFET 102 driving the latter into the ON state.

Sensor circuitry 120 has first and second inputs 122 and 124 connected to bond wire 106 within housing module 104 at spaced points 126 and 128 along the bond wire and senses current flow through bond wire 106 by sensing voltage between points 126 and 128. Inputs 122 and 124 are connected to an existing bond wire such as 18 in FIG. 1 at the noted spaced points without insertion of any additional series resistance in the bond wire between such points. Alternatively, inputs 122 and 124 are connected to the structure shown in FIGS. 2 and 5 and utilizes current sense lead frames 38b and 52 as the inputs 122 and 124, respectively, to sensing circuitry 120, without insertion of any additional series resistance in bond wire 50 between points 42 and 58. Further alternatively, inputs 122 and 124 are connected to the structure shown in FIGS. 2 and 6 of the noted '632 application and uses lead frames 38 and 52 as the inputs 122 and 124, respectively, to sensing circuitry 120, without insertion of any additional series resistance in bond wire 50 between points 42 and 58.

Amplifier 130 has noninverting and inverting inputs 132 and 134 connected to bond wire 106 at points 126 and 128, respectively, and senses current flow through bond wire 106 by sensing voltage between points 126 and 128, and amplifies such voltage. Comparator 136 compares the amplified voltage against a reference voltage 138 and generates an output signal by going low at output 140 when the amplified voltage exceeds the reference voltage by a given amount. Disabling means is provided by an AND gate 142 responsive to the output signal from comparator 136 on line 140 and disables the control drive circuitry 118 from supplying the gate drive signal to MOSFET 102. Alternatively, another semiconductor switch such as a bipolar transistor is provided in series in the gate control drive circuitry to terminal 116 to disable such circuitry from supplying the gate drive signal to MOSFET 102.

Figure 7:
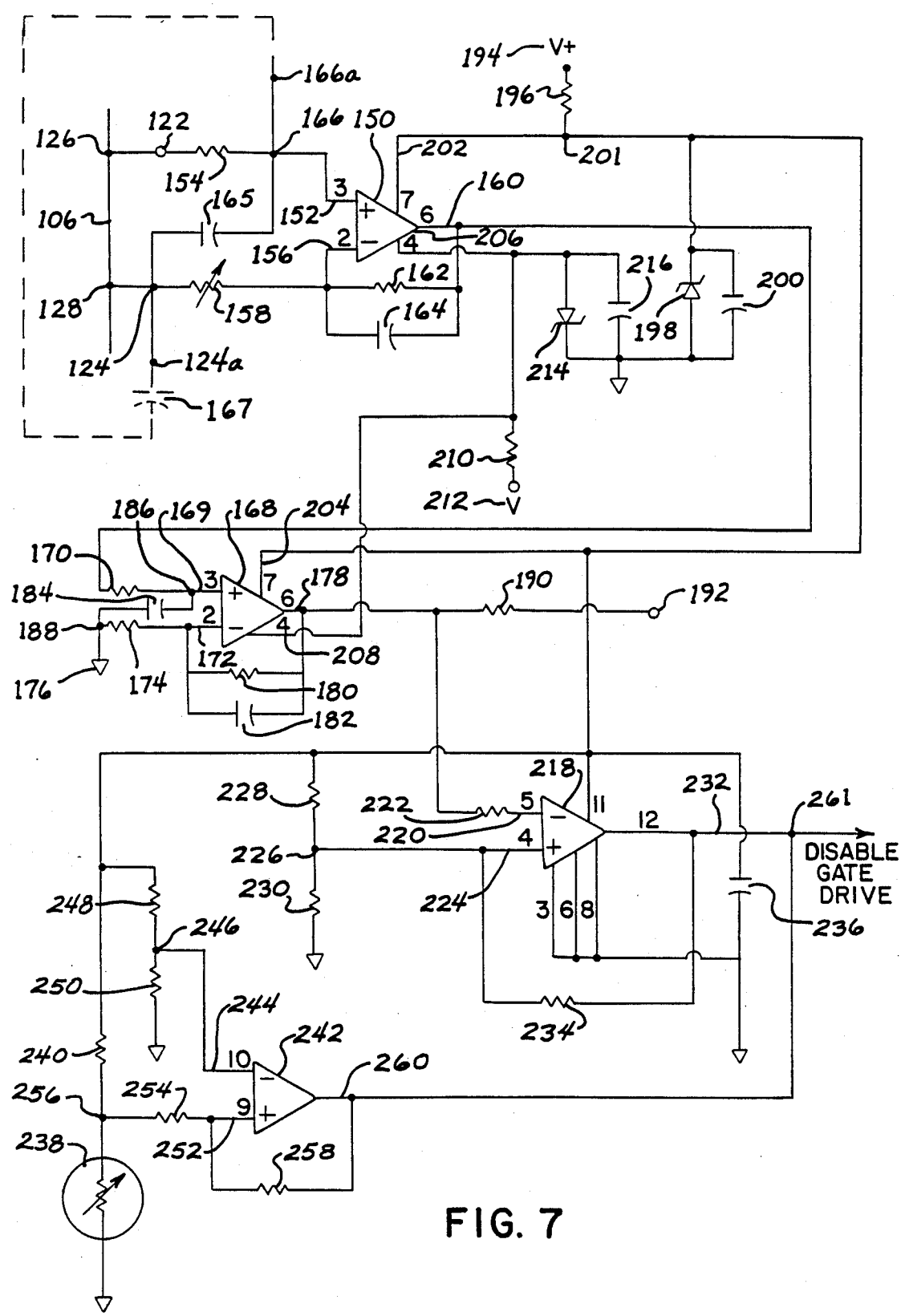
FIG. 7 is a circuit diagram showing further detailed current sense circuitry in accordance with the invention.

FIG. 7 shows preferred circuitry in accordance with the invention. Inputs 122 and 124 are connected to source bond wire 106 at spaced points 126 and 128. Amplifier 150, provided by an HA5147 amplifier, or the like, where manufacturer assigned pin number designations are shown, has its noninverting input 152 connected through resistor 154 to bond wire 106 at point 126, and has its inverting input 156 connected through variable resistor 158 to bond wire 106 at point 128. Amplifier 150 has an output 160 connected in a feedback loop to input 156. The feedback loop includes a voltage divider provided by resistors 158 and 162, and a capacitor 164 in parallel with resistor 162 between output 160 and input 156. The ratio of resistor 162 to variable resistor 158 sets the gain of the amplifier and adjusts the current limit threshold. Capacitor 164 provides a minimal delay and prevents oscillation. Capacitor 165 has one plate connected to node 166 between resistor 154 and amplifier input 152, and has its other plate connected to node 124 between bond wire point 128 and resistor 158. Capacitor 165 and resistor 154 form a low pass filter which filters out high frequency noise. The size of this filter is externally adjustable by the addition of a compensation capacitor as shown in dashed line at 167 connected between the compensation plus terminal 166a and compensation minus terminal 124a, in parallel with capacitor 165. This allows for an adjustment of the compromise between the degree of noise filtering and the response time of the protection circuit to an overcurrent condition.

A second amplifier 168, provided by an HA5147 amplifier or the like, where manufacturer assigned pin number designations are shown, has its noninverting input 169 connected through resistor 170 to the output 160 of amplifier 150, and has its inverting input 172 connected through resistor 174 to a fixed reference 176 such as ground. The output 178 of amplifier 168 is connected in a feedback loop including resistor 180 and capacitor 182 to input 172. The ration of resistor 180 to resistor 174 sets the gain of amplifier 168, and capacitor 182 provides minimal delay and prevents oscillation. Capacitor 184 has one plate connected to node 186 between resistor 170 and input 169 of amplifier 168, and has its other plate connected to node 188 between reference 176 and resistor 174. Output 178 of amplifier 168 is connected through current limiting resistor 190 to current sense monitor terminal 192 for sensing the amplified voltage as a measure of current flow through bond wire 106.

Power supply voltage is provided from a positive voltage source 194 connected through resistor 196 and regulated by zener diode 198 and filtered by capacitor 200. This regulated voltage at node 201 is supplied to the power supply inputs 202 and 204 of amplifiers 150 and 168. The return reference power supply terminals 206 and 208 of the amplifiers are connected through resistor 210 to minus voltage source 212 which is regulated by zener diode 214 and filtered by capacitor 216.

Comparator 218, provided by half of an LM319 integrated circuit chip or the like, where manufacturer assigned pin number designations are shown, has its inverting input 220 connected through resistor 222 to output 178 of amplifier 168, and has its noninverting input 224 connected to node 226 supplying a reference voltage by its connection through the voltage divider provided by resistors 228 and 230 to the power supply at node 201. Resistor 222 serves to cancel the error due to input offset bias current in the comparator. Comparator 218 has an output 232 which goes low when the amplified output voltage from amplifier output 178, representing current flow through bond wire 106, exceeds the reference voltage at node 226 by a given amount, as set by resistor 234. Resistor 234 therefore controls the amount of comparator hysteresis or deadband to prevent oscillation of the comparator output. Output 232 is output 140 in FIG. 6, and hence when output 232 goes low, gate drive to MOSFET 102 is disabled. Capacitor 236 provides further filtering and decoupling of the power supply voltage.

An NTC thermistor 238 is connected through resistor 240 to the power supply at node 201. NTC thermistor 238 is mounted adjacent to MOSFET 102 and senses the temperature thereof, such that as the sensed temperature rises, the resistance of thermistor 238 decreases. Comparator 242, provided by the other half of the above noted LM319 chip or the like, where manufacturer assigned pin number designations are shown, has its inverting input 244 connected to node 246 providing a reference voltage through the voltage divider network provided by resistors 248 and 250 connected to the power supply at node 201. Comparator 242 has its noninverting input 252 connected through resistor 254 to node 256 between thermistor 238 and resistor 240. Resistor 254 serves to cancel the error due to input offset bias current in the comparator. When the temperature of MOSFET 102 rises to a given level, the resistance of thermistor 238 decreases to a given value which in turn reduces the voltage at node 256 below the reference voltage at node 246 by a given amount, as set by resistor 258, such that the output 260 of comparator 242 goes low, to disable gate drive to MOSFET 102. Resistor 258 controls the amount of comparator hysteresis to prevent oscillation of the comparator output. Comparator outputs 232 and 260 are commonly connected at node 261 in an OR gate configuration so as to disable the gate drive to MOSFET 102 in the event of overcurrent or overtemperature conditions. This provides output 140 in FIG. 6.

It is recognized that various equivalents, alternatives and modifications are possible within the scope of the appended claims.

What is claimed is:

1. A current sense circuit comprising:

a semiconductor switch comprising a semiconductor chip having a pair of main terminal metallization contact pads, a conductor jumper bond wire directly connected to one of said pads, a control terminal metallization contact pad with a conductor jumper bond wire directly connected thereto for controlling the conduction state of said semiconductor switch between an ON state passing current between said main contact pads, and an OFF state blocking current flow between said main contact pads;

control drive circuitry connected to said second mentioned bond wire and having an enabled state supplying a drive signal to said semiconductor switch driving the latter into said ON state;

amplifier means having first and second inputs connected to said first mentioned bond wire at spaced points therealong and sensing current flow through said first bond wire by sensing voltage between said spaced points and amplifying said voltage;

comparator means comparing said amplified voltage against a reference voltage and generating an output signal when said amplified voltage exceeds said reference voltage by a given amount;

disabling means responsive to said output signal from said comparator means and disabling said control drive circuitry from supplying said drive signal to said semiconductor switch, wherein said amplifier means comprises:

a first amplifier having first and second inputs and an output;

a first resistor connected between said first bond wire at one of said spaced points and said first input of said first amplifier;

a second resistor connected between said first bond wire at the other of said spaced points and said second input of said first amplifier;

a third resistor connected between said output of said first amplifier and said second input of said first amplifier;

a first capacitor connected between said first and second resistors;

a second capacitor connected between said output of said first amplifier and said second input of said first amplifier;

a second amplifier having first and second inputs and an output;

a fourth resistor connected between said output of said first amplifier and said first input of said second amplifier;

a fifth resistor connected between a reference point and said second input of said second amplifier;

a sixth resistor connected between said output of said second amplifier and said second input of said second amplifier;

a third capacitor connected between said fourth and fifth resistors;

a fourth capacitor connected between said output of said second amplifier and said second input of said second amplifier;

and wherein said comparator means comprises a comparator having a first input connected to said output of said second amplifier, and a second input supplied by said reference voltage, and an output supplying said output signal.

2. The invention according to claim 1 further comprising in combination:

thermistor means sensing the temperature of said semiconductor chip;

a second comparator having a first input connected to said thermistor and a second input supplied by a reference voltage and comparing thermistor voltage thereagainst, and having an output connected to said output of said first mentioned comparator and supplying an output signal when thermistor voltage reaches a given value corresponding to an overtemperature condition of said semiconductor chip, such that said disabling means responds to said output signal from said output of said first comparator to disable said control drive circuitry from supplying said drive signal to said semiconductor switch and also responds to said output signal from said output of said second comparator to disable said control drive circuitry from supplying said drive signal to said semiconductor switch, to provide in combination both overcurrent and overtemperature protection.

3. The invention according to claim 1 wherein said second resistor is variable and adjusts the current limit threshold for overcurrent protection.

* * * * *